US006858079B2

(12) United States Patent
Norris et al.

(10) Patent No.: US 6,858,079 B2
(45) Date of Patent: Feb. 22, 2005

(54) SELF-ASSEMBLED PHOTONIC CRYSTALS AND METHODS FOR MANUFACTURING SAME

(75) Inventors: David J. Norris, Princeton, NJ (US); Yurii Vlasov, Plainsboro, NJ (US); Xiang-Zheng Bo, Princeton, NJ (US); James C. Sturm, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 0 days.

(21) Appl. No.: 09/946,343

(22) Filed: Sep. 6, 2001

(65) Prior Publication Data

US 2002/0062782 A1 May 30, 2002

Related U.S. Application Data

(60) Provisional application No. 60/253,349, filed on Nov. 28, 2000.

(51) Int. Cl.$^7$ ................................................. C30B 7/02
(52) U.S. Cl. ..................... 117/70; 117/3; 117/4; 117/69; 117/952
(58) Field of Search ........................... 117/3, 4, 68, 70, 117/952

(56) References Cited

U.S. PATENT DOCUMENTS

| | | | |
|---|---|---|---|
| 4,935,456 A | * | 6/1990 | Huang et al. ............. 523/207 |
| 5,385,114 A | | 1/1995 | Milstein et al. |
| 5,540,951 A | | 7/1996 | Nagayama et al. |

(List continued on next page.)

OTHER PUBLICATIONS

Joannopoulous, J.D. et al., "Photonic Crystals: Putting a New Twist on Light," Nature, vol. 386, pp. 143–149, Mar. 13, 1997.

Noda, S. et al., "Full Three–Dimensional Photonic Bandgap Crystals at Near–Infrared Wavelengths," Science, vol. 289, pp. 604–606, Jul. 28, 2000.
Blanco, A. et al., "Large–Scale Synthesis of a Silicon Photonic Crystal With a Complete Three–Dimensional Bandgap near 1.5 Micrometres," Nature, vol. 405, pp. 437–440, May 25, 2000.
Denkov, N.D. et al., "Two–Dimensional Crystallization," Nature, vol. 361, p. 26, Jan. 7, 1993.
Jiang, P., et al., "Template–Directed Preparation of Macroporous Polymers With Oriented and Crystalline Arrays of Voids," J. Am. Chem. Soc., pp. 11630–11637, Nov. 30, 1999.
Stober, W. et al., "Controlled Growth of Monodisperse Silica Spheres in the Micron Size Range," Journal of Colloid and Interface Science, pp. 62–69, 1968.
Busch, K. et al., "Photonic Band Gap Formation in Certain Self–Organizing Systems," Physical Review E, vol. 58, No. 3, pp. 3896–3908, Sep. 1998.

(List continued on next page.)

Primary Examiner—Nadine G. Norton
Assistant Examiner—Matthew Anderson

(57) ABSTRACT

Self-assembled photonic crystals, including large sphere planar opals, infiltrated planar opals and inverted planar opals, as well as methods for manufacturing same are provided. Large sphere planar opals are manufactured according to a method comprising the steps of: synthesizing monodisperse silica spheres, wherein each of the silica spheres has a diameter greater than or equal to about 400 nanometers; purifying the silica spheres; and self-assembling the silica spheres into a plurality of ordered, planar layers on a substrate. Infiltrated planar opals may also be manufactured by further processing the large sphere planar opal by sintering the planar opal and infiltrating the planar opal with a predetermined material. Inverted planar opals may further be manufactured by removing the silica spheres from the infiltrated planar opal. Various modifications to the substrate and planar opal are also provided to enhance the properties of these photonic crystals.

67 Claims, 12 Drawing Sheets

U.S. PATENT DOCUMENTS

| | | | |
|---|---|---|---|
| 5,651,818 | A | 7/1997 | Milstein et al. |
| 5,688,318 | A | 11/1997 | Milstein et al. |
| 6,139,626 | A | 10/2000 | Norris et al. |
| 6,228,340 | B1 * | 5/2001 | Imhof et al. ................. 423/338 |
| 6,261,469 | B1 | 7/2001 | Zakhidov et al. |
| 2001/0019037 | A1 * | 9/2001 | Zakhidov et al. ............. 216/56 |
| 2002/0045030 | A1 | 4/2002 | Ozin et al. |
| 2002/0074537 | A1 * | 6/2002 | John et al. ................... 252/584 |
| 2002/0143073 | A1 * | 10/2002 | Jiang et al. .................... 516/98 |
| 2002/0173610 | A1 * | 11/2002 | Aert et al. ................ 526/303.1 |
| 2003/0156319 | A1 * | 8/2003 | John et al. ................ 359/341.5 |

OTHER PUBLICATIONS van Blaaderen, A. et al., "Template–Directed Colloidal Crystallization," Nature, vol. 385, pp. 321–324, Jan. 1997.

Brittain, S. et al., "Soft Lithography and Microfabrication," Physics World, vol. 11, pp. 31–36, May 1998.

Ozin, G.A. et al., "The Race for the Photonic Chip: Colloidal Crystal Assembly in Silicon Wafers," Advanced Functional Material, vol. 11, No. 2, pp. 95–104, Apr. 2001.

Yang, S.M. et al., "Opal Chips: Vectorial Growth of Colloidal Crystal Pattersn inside Silicon Wafers," The Royal Society of Chemstry, pp. 2507–2508, 2000.

Ozin, et al. manuscript, "The Race for the Photonic Chip: Opal–Patterned Chip, Colloidal Crystal Self–Assembly in Silicon Wafers", unpublished manuscript, dated Nov. 25, 2000.

* cited by examiner

SELF-ASSEMBLED PHOTONIC CRYSTALS AND METHODS FOR MANUFACTURING SAME

CROSS-REFERENCE TO RELATED APPLICATION

This application claims the benefit of U.S. Provisional Application No. 60/253,349 filed Nov. 28, 2000.

FIELD OF THE INVENTION

The present invention relates to the formation of photonic crystals—structures that are periodically patterned and highly-ordered in three dimensions. The invention demonstrates a simple and inexpensive self-assembly method by which photonic crystals can be made. A key component of this invention is that it allows these structures to be easily integrated into current semiconductor wafer technology. Since, in addition, these structures can have a complete photonic band gap at optical wavelengths, the invention provides a photonic band gap material suitable for use in optoelectronic devices. Further, the invention relates how these materials can be further processed to obtain optical integrated circuits.

BACKGROUND OF THE INVENTION

With modern methods of materials processing, structures can now be fabricated on the nanometer-length scale. As is well-known in the art, techniques developed in the semiconductor industry (for example, electron beam lithography) can define complicated patterns with nanometer resolution. However, since these techniques are typically restricted to working at a material interface or surface layer (that is, in a typically two-dimensional format), much effort is required to use these methods to define a pattern in three dimensions. In particular, many layers of such a two-dimensional patterned material must typically be united to create a three-dimensional patterned material. Many steps are required to produce each layer, and it therefore becomes prohibitive, both in terms of cost and time, to use these techniques (which are referred to herein as standard lithographic approaches) to build multi-layered structures.

One particular application in which a method for producing materials with a three-dimensional pattern is useful is in photonic crystals. A review of the properties and applications of such materials can be found in an article by Joannopoulos et al. entitled "Photonic Crystals: Putting a New Twist on Light," *Nature*, Vol. 386, pp. 143-149 (Mar. 13, 1997). Simply stated, a photonic crystal is a material with a periodic index of refraction. When the modulation of the index occurs on a length scale comparable to the wavelength of light, the material can modify the propagation of the photon through the material via diffraction. The extreme example is a photonic crystal which possesses a complete photonic band gap, a range of energies for which the photon cannot propagate in any direction inside the material. Many applications and photonic devices have been predicted for photonic crystal structures that have a complete photonic band gap. However, to obtain a material with a complete photonic band gap, the photonic crystal must: (1) be made from very specific materials (typically, but not limited to, high refractive index materials such as semiconductors) and (2) have the correct three-dimensional structure to open a complete photonic band gap. Since these criteria are difficult to satisfy, photonic band gap materials that are suitable for optical wavelengths have been extremely challenging to fabricate and only a few examples have been realized. One example was recently reported by Noda et al., "Full Three-Dimensional Photonic Bandgap Crystals at Near-Infrared Wavelengths," *Science*, Vol. 289, pp. 604-606 (Jul. 28, 2000). This structure was obtained by using standard lithographic approaches.

However, to avoid the inherent difficulties of using standard lithographic approaches, as discussed above, many researchers have recently been exploring so-called self-assembly methods to provide a much simpler and less expensive route to photonic crystals and photonic band gap materials. A common approach that is well known in the art is to utilize sub-micron colloidal spheres (e.g. polymer or silica), which can be induced to spontaneously order on a face-centered cubic (fcc) lattice. In nature, this process leads to gemstone opals. In analogy, sub-micron spheres assembled in the laboratory are referred to as synthetic opals. Unfortunately, as prepared, synthetic opals are not particularly interesting photonic crystals. For example, silica has a relatively low refractive index (about 1.4). However, since the interstitial spaces between the spheres are empty, they can be filled with other materials. In this way, the opal can be used as a template. Subsequent removal of the template, either by etching or burning away the spheres, leads to so-called inverted opals. A variety of such structures, including carbon, metal oxides, polymers, metals, and semiconductors can now be prepared using this procedure. In general, inverted opals have been studied since, in principle, they can have the proper symmetry (fcc), volume fraction (about 20%), and refractive index contrast (>2.85), necessary to obtain a complete photonic band gap at visible or near visible wavelengths. Thus, this approach has been explored as a simple method to obtain complete optical photonic band gaps.

One way to satisfy the criteria for the structure to have a complete photonic band gap is to fill the opal with a high refractive index material. Various methods have been proposed to achieve this. Milstein et al. have described, in very general terms, methods for preparing photonic band gap materials in which the pores of a reticulated template are filled with a high index material. See U.S. Pat. Nos. 5,385,114, 5,651,818 and 5,688,318. The high index material is incorporated into the template either as a liquid or gas and then solidified. Such an approach has been described in more detail in a recent paper by Blanco et al., "Large-Scale Synthesis of a Silicon Photonic Crystal with a Complete Three-Dimensional Bandgap Near 1.5 Micrometers," *Nature*, Vol. 405, pp. 437–440 (May 25, 2000), where chemical vapor deposition of disilane is used to fill the opal template with silicon. After deposition, chemical etching is used to remove the template and a structure, defined as a "silicon inverted opal", is obtained. Since silicon has an index of refraction of 3.5 in the near infrared, these structures can, in principle, satisfy all the criteria for a complete photonic band gap at 1.3 or 1.5 micrometers, the main wavelengths for optical communications. Thus, such structures could be extremely useful for making inexpensive photonic crystal devices for applications in telecommunications.

However, because Blanco et al. use a large (millimeter- or centimeter-scale) opal template to make silicon photonic crystals, this approach leads to several difficulties in terms of device applications. Blanco et al. use the most common method for preparing the synthetic opal, sedimentation. In sedimentation, colloidal spheres are mixed in a solvent and allowed to slowly settle and self-assemble onto a flat substrate. The final sediment is then sintered to obtain a macroscopic (millimeter- or centimeter-scale) template.

While the resulting structure is a highly ordered crystal of sub-micron spheres on a local scale, due to the macroscopic size of sedimented opals, they are polycrystalline. In other words, the macroscopic opal is comprised of a large collection of small crystalline domains of spheres, roughly 50–100 $\mu$m in diameter. The random orientation of these individual domains, and the potential for disordered regions of spheres between the domains, causes a significant and undesirable deterioration in the photonic properties of these materials. In particular, any disorder or polycrystallinity that is present in the original opal template is automatically transferred into the silicon inverted opal.

Another problem with the use of sedimented opals, is that the resulting silicon photonic crystal is difficult to integrate into current optoelectronic technology. For example, it is desirable to place a photonic crystal device directly on a semiconductor substrate, such as a wafer, to facilitate interactions with other more traditional electronic devices on the same substrate. Furthermore, by placing the photonic crystal on a semiconductor wafer it could be more easily adapted into current semiconductor device fabrication lines. However, the large size, irregular shape, and polycrystallinity of inverted opals made from sedimented opals makes this difficult to achieve.

Accordingly, a need exists for a simple method to make photonic crystals that are easily integratable into current semiconductor wafer technology. The present invention describes how to avoid the problems caused by sedimented opals and prepare thin, planar, photonic crystals that are fabricated directly on a semiconductor wafer. Since the photonic crystals can be made from high refractive index materials, the resulting structures can exhibit a complete photonic band gap. Our approach not only allows integration with current semiconductor technology, but it is simpler, less time-consuming, and more adaptable to large-scale production than the prior art. Furthermore, once the thin photonic crystal is prepared by the method of this invention, it is easily processed with a variety of standard techniques to obtain integrated optical circuits.

Instead of using a sedimented opal as a photonic crystal template, the present invention provides a new form of template, referred to as a "planar opal". The formation of planar opals relies on capillary forces to uniformly deposit a specific number of layers (e.g. 25) of close-packed colloidal spheres onto a large area substrate. This method has been used previously to make two-dimensionally periodic monolayers of spheres, see Denkov et al., "Two-Dimensional Crystallization", *Nature*, Vol. 361, p. 26 (1993) and U.S. Pat. No. 5,540,951. More recently, it has been extended to make three-dimensional opaline structures. Jiang et al., see "Template-Directed Preparation of Macroporous Polymers with Oriented and Crystalline Arrays of Voids", *Journal of the American Chemical Society*, Vol. 121, pp. 11630–11637 (1999), showed how to place a glass substrate vertically in a solution of colloidal spheres. Slow evaporation of the solvent under the appropriate conditions leaves a deposit of three-dimensionally ordered spheres on a face-centered cubic lattice. The spheres are deposited directly on the template. While point defects remain, these structures have the potential of being single crystals. Thus, these planar opals are superior to sedimented opals in that they are not polycrystalline, they are of a well-defined thickness, and they have a known crystal orientation.

However, Jiang et al. clearly state that their method does not work for colloidal spheres with diameters larger than about 400 nm. Spheres this large, referred to herein as "large spheres," quickly sediment before the solvent can evaporate. Thus, the planar opal does not form. Unfortunately, for many important applications large spheres as defined above are required. This is because the size of the sphere determines the lattice constant of the photonic crystal. The lattice constant, in turn, determines the optical wavelength of the photonic band gap. To place the photonic band gap at the technologically interesting wavelength of 1.5 micrometers, the opal must be made of spheres of approximately 850 nm. Further, to obtain a complete photonic band gap in silicon photonic crystals, the position of the band gap must be below the absorption edge of the semiconductor (about 1.1 micrometers). This requires spheres larger than 640 nm. Therefore, a need exists for a simple method to form planar opals from large spheres.

SUMMARY OF THE INVENTION

The present invention provides a simple method to form such large sphere planar opals. The term "large sphere planar opals" is used herein to imply planar opal templates that are made from silica spheres with diameters larger than about 400 nm. Through the use of this invention, large sphere planar opals can be obtained that are best suited for fabrication of technologically relevant photonic crystals.

The present invention provides a straightforward method for manufacturing three-dimensionally periodic photonic crystals. The starting materials are: a) the chemicals required to synthesize silica colloids, b) clean semiconductor substrates, and c) a suitable gas (or gases) to deposit the predetermined material, typically a high refractive index predetermined material, such as a semiconductor. The process involves the following steps, as shown in FIG. 1: (step 1) synthesizing monodisperse silica spheres, each having a diameter greater than or equal to about 400 nanometers; (step 2) purifying the silica spheres to remove impurities and contaminants; (step 3) self-assembling the silica spheres into a plurality of ordered, planar layers on a substrate (such as a semiconductor) to form a planar opal; (step 4) sintering the planar opal with heat to slightly fuse the close-packed silica spheres and increase the strength of the assembly; (step 5) infiltrating the planar opal with the predetermined material. This method provides a planar opal that has been infiltrated with the predetermined material. The resulting photonic crystal material (material A in FIG. 1) is defined as an "infiltrated planar opal." Typically, this material is a high refractive index material, such as a semiconductor. However, it may also be another material, such as a metal, organic semiconductor, or any material with a desirable property.

Further embodiments are possible through variations of two further steps shown in FIG. 1: (step 6) removing the silica spheres from the structure, for example, by chemical etching; (step 7) after removal of silica spheres from the photonic crystal, the structure may be further modified, structured, altered, processed, or patterned, by some additional process (mechanical, chemical, electrical, or optical), if desired, for example to obtain an optical integrated circuit or other desired device directly on the semiconductor substrate. This latter step (step 7) can also be used to further process the structure (for example, add new layers of material to the substrate, remove material from the substrate, add new material to the photonic crystal, remove material from the photonic crystal, or pattern the substrate) in some desirable way. When it is desirable to add new material to the photonic crystal, the photonic crystal can be refilled, partially or completely, with another predetermined material, which may be a semiconductor, metal, or any material with a desirable property.

Still further embodiments are possible through variations in a further optional step as shown in FIG. 1: (step 8) without removal of the silica from the photonic crystal, the structure may be further modified, structured, altered, processed, or patterned, by some additional process (mechanical, chemical, electrical, or optical), for example to obtain an optical integrated circuit or other desired device directly on the semiconductor substrate. This step (step 8) can also be used to further process the structure (for example, add new layers of material to the substrate, remove material from the substrate, add new material to the photonic crystal, remove material from the photonic crystal, or pattern the substrate) in some desirable way.

By utilizing these additional embodiments, the following additional materials may be produced by the present invention:

A material (identified as B in FIG. 1) which results from steps 1, 2, 3, 4, 5 and 6—an infiltrated planar opal in which the silica spheres have been removed from the structure and replaced by air, vacuum, or some other gas. This material is defined as an "inverted planar opal".

A material (identified as C in FIG. 1) which results from steps 1, 2, 3, 4, 5, 6 and 7—an inverted planar opal which has been subsequently modified, structured, altered, processed, or patterned by some additional process (mechanical, chemical, electrical, or optical) to obtain a photonic crystal with a desired form, shape, pattern or position on the wafer. The planar opal can be coated, plated, refilled, either partially or completely, with another material, which may be a semiconductor, metal, or any material with a desirable property. This material is defined as a "post-modified inverted planar opal".

A material (identified as D in FIG. 1) which results from steps 1, 2, 3, 4, 5 and 8—an infiltrated planar opal which has been subsequently modified, structured, altered, processed, or patterned by some additional process (mechanical, chemical, electrical, or optical) to obtain a photonic crystal with a desired form, shape, pattern, or position on the wafer. This material is defined as a "post-modified infiltrated planar opal".

Further embodiments are possible, as shown in FIG. 2, through variations by adding one additional optional step: (step 2a in FIG. 2) the semiconductor substrate may be modified, structured, altered, processed, or patterned by some additional process (mechanical, chemical, electrical, or optical) prior to formation of the planar opal template on the semiconductor substrate. By utilizing these additional embodiments, the following additional materials may be produced by the present invention:

A material (identified as A' in FIG. 2) which results from steps 1, 2, 2a, 3, 4 and 5—an infiltrated planar opal which has been modified, structured, altered, processed, or patterned by some additional process (mechanical, chemical, electrical, or optical) in a desirable way and/or an infiltrated planar opal which has formed on a semiconductor substrate which has been modified, structured, altered, processed, or patterned by some additional process (mechanical, chemical, electrical, or optical) in a desirable way. This material is defined as a "pre-modified infiltrated planar opal".

A material (identified as B' in FIG. 2) which results from steps 1, 2, 2a, 3, 4, 5 and 6—an inverted planar opal which has been modified, structured, altered, processed, or patterned by some additional process (mechanical, chemical, electrical, or optical) in a desirable way and/or an inverted planar opal which has formed on a semiconductor substrate which has been modified, structured, altered, processed, or patterned by some additional process (mechanical, chemical, electrical, or optical) in a desirable way. This material is defined as a "pre-modified inverted planar opal".

A material (identified as C' in FIG. 2) which results from steps 1, 2, 2a, 3, 4, 5, 6 and 7—a pre-modified inverted planar opal which has been subsequently modified, structured, altered, processed, or patterned by some additional process (mechanical, chemical, electrical, or optical) to obtain a photonic crystal with a desired form, shape, pattern or position on the wafer. The pre-modified inverted planar opal can be coated, plated, refilled, either partially or completely, with another material, which may be a semiconductor, metal, or any material with a desirable property. This material is defined as a "pre- and post-modified inverted planar opal".

A material (identified as D' in FIG. 2) which results from steps 1, 2, 2a, 3, 4, 5 and 8—an pre-modified infiltrated planar opal which has been subsequently modified, structured, altered, processed, or patterned by some additional process (mechanical, chemical, electrical, or optical) to obtain a photonic crystal with a desired form, shape, pattern or position on the wafer. This material is defined as a "pre- and post-modified infiltrated planar opal".

Accordingly, a principal object of the present invention is to provide a simple, inexpensive, and flexible method for manufacturing planar opals that are made from large spheres (diameters greater than about 400 nm).

Another object of the present invention is to provide a method for manufacturing planar semiconductor photonic crystals that are three-dimensionally periodic on an optical length scale.

A still further object of the present invention is to provide a method for manufacturing planar photonic crystals that are three-dimensionally periodic on an optical length scale and are made from noble metals.

A still further object of the present invention is to provide a method for manufacturing planar photonic crystals that are three-dimensionally periodic on an optical length scale and are made from high refractive index materials.

A still further object of the present invention is to provide a method for manufacturing planar photonic crystals that exhibit a complete photonic band gap.

A still further object of the present invention is to provide a method for manufacturing planar photonic crystals that are three-dimensionally periodic on an optical length scale and formed directly on a semiconductor substrate, in particular a silicon wafer.

A still further object of the present invention is to provide a method for manufacturing planar photonic crystals that are three-dimensionally periodic on an optical length scale and are placed on a patterned or structured substrate.

A still further object of the present invention is to provide a method for manufacturing planar photonic crystals that are three-dimensionally periodic on an optical length scale and are further patterned or structured on a larger length scale (greater than 1 micron).

A still further object of the present invention is to provide a method for manufacturing planar photonic crystals that are three-dimensionally periodic on an optical length scale and are further patterned or structured on a length scale comparable to the wavelength of light (comparable to or smaller than 1 micron).

A still further object of the present invention is to provide a method for manufacturing optical integrated circuits made from planar photonic crystals.

Other objects of the present invention will become more readily apparent in light of the following description in conjunction with the accompanying drawings.

DETAILED DESCRIPTION OF THE PREFERRED EMBODIMENTS

Figure 1:
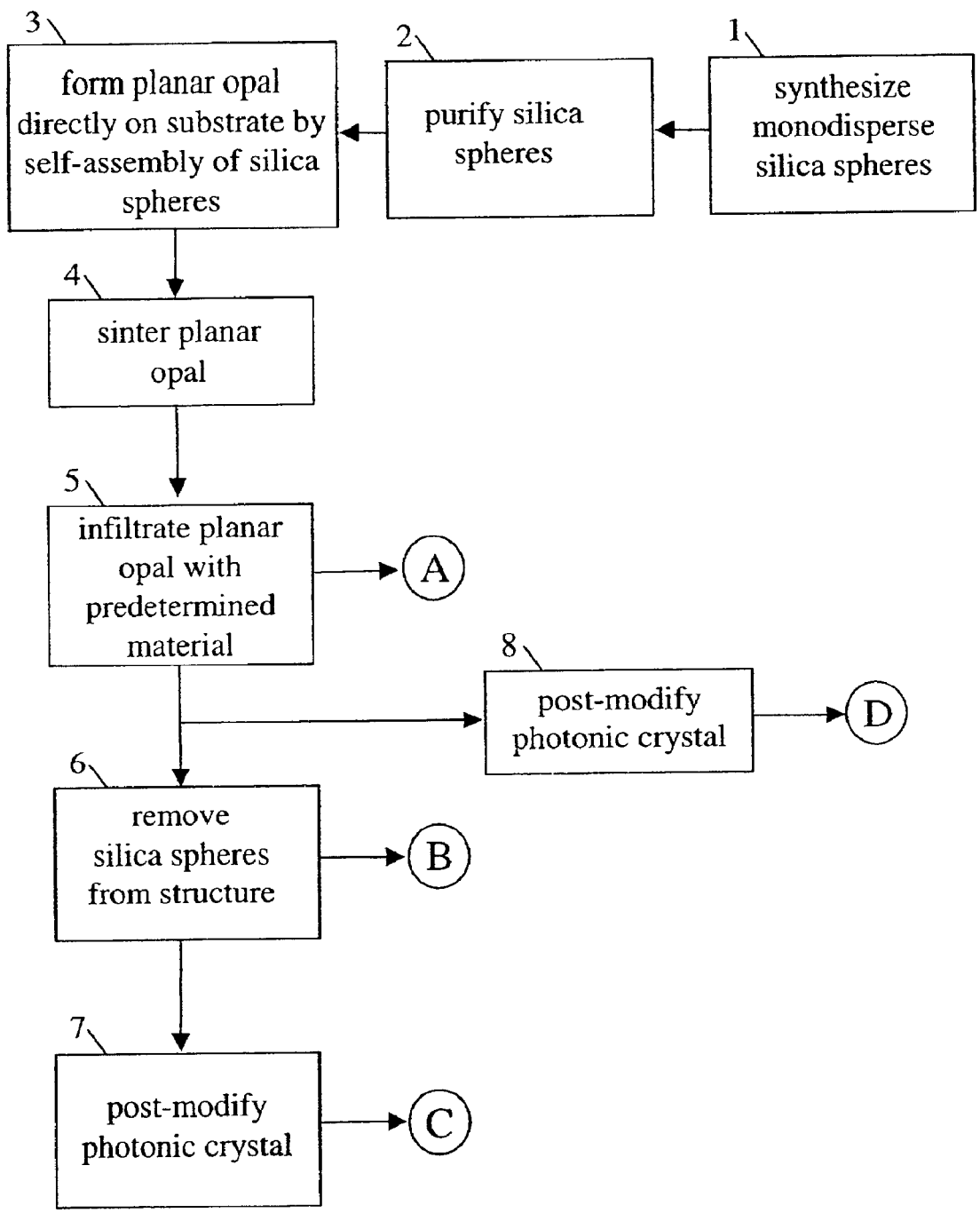
FIG. 1 is a flow diagram that depicts the steps of the methods for making planar photonic crystal materials of the present invention, including the sequences of steps that produce four different materials A, B, C and D in accordance with the present invention.
Figure 2:
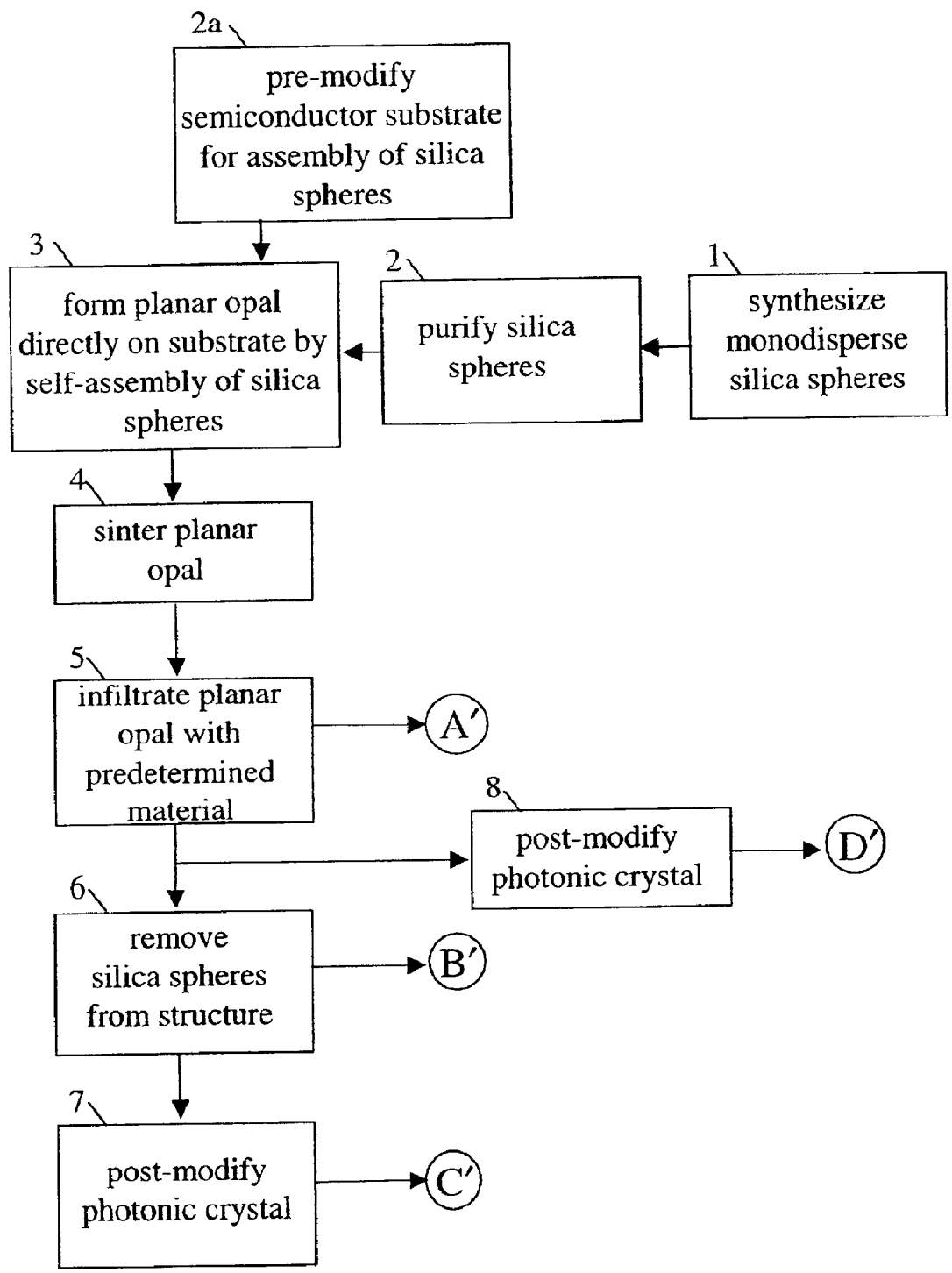
FIG. 2 is a flow diagram that depicts the steps of the methods for making planar photonic crystal materials of the present invention, including the sequences of steps that produce four different materials A', B', C' and D' in accordance with the present invention.

Reference is now made to FIGS. 1 and 2, which are flow diagrams illustrating the principal steps of the methods of the present invention and identifying the materials produced by these methods. In FIGS. 1 and 2, rectangles denote method steps, and circled letters (A through D and A' through D') identify materials (compositions of matter) produced by the methods of the present invention. In all methods, the starting materials are the following: water, ethanol, ammonia, tetraethoxysilane (TEOS), a silicon wafer or other suitable semiconductor substrate, and a precursor gas (or gases) for the infiltration of the predetermined material into the opal template.

As shown in FIGS. 1 and 2, step 1 is synthesizing silica spheres with sub-micron diameters as is known in the art. One preferable and well-known method for preparing colloidal silica spheres with sub-micron diameters is that of St öber et al. as set forth in "Controlled Growth of Monodisperse Silica Spheres in the Micron Size Range," *Journal of Colloid and Interface Science*, Vol. 26, pp. 62–69 (1968). With due care, this method yields silica spheres that are monodisperse; that is, spheres that are all the same diameter within a few percent. When preparing monodisperse silica spheres, it is important that the reaction vessel, the solvents, and the reactants are free of unwanted nucleation sites (such as dust). Accordingly, all reaction vessels are preferably pre-cleaned in aqueous hydrofluoric acid (HF) and the solvents and reactants are preferably distilled and filtered. Thus, monodisperse silica spheres can be synthesized with a desired diameter anywhere from 0.05 to 2 microns. The monodispersity of the spheres is critical for the proper assembly of the spheres during the formation of the opal template (see step 3 below). The standard deviation in the diameter of the spheres should be less than 3% and is preferably less than 1%.

As shown in FIGS. 1 and 2, step 2 is purifying the silica spheres to remove excess reactants or other unwanted contaminants. These contaminants can interfere with the assembly of the spheres during the formation of the opal template (see step 3 below). This is particularly true when making large sphere planar opals (defined above), which are necessary for making silicon opal structures with a complete photonic band gap or semiconductor opal structures with a complete photonic band gap at a technologically relevant wavelength such as 1.5 microns. The purification step 2 includes removing the spheres from the original reaction solution (e.g. by centrifugation or sedimentation) and resuspending the spheres in a fresh clean solvent, such as distilled water or ethanol. After thorough mixing, this process is then preferably repeated many times (and most preferably more than 10 times) until the spheres are free from unwanted contaminants (such as reaction by-products, for example).

Figure 3A:
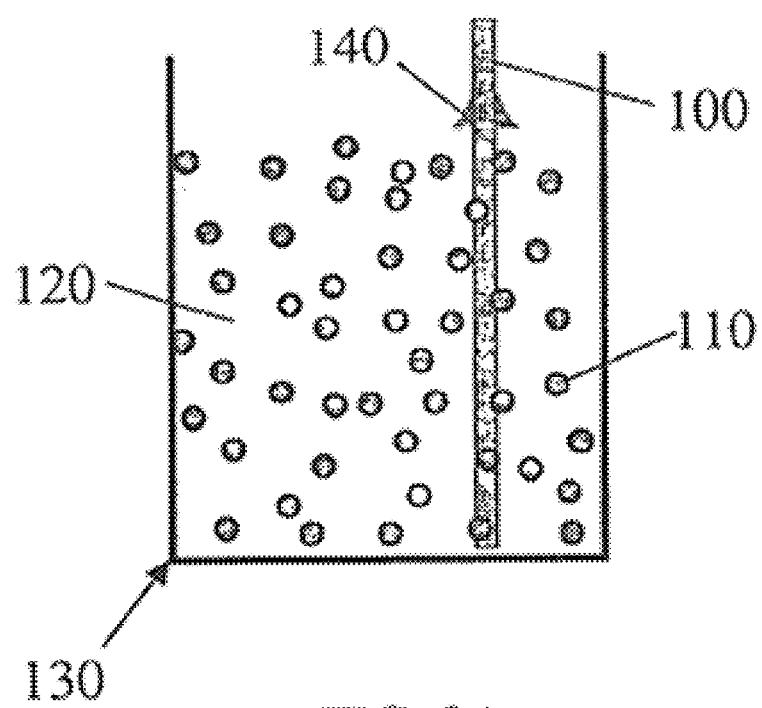
FIGS. 3A and 3B are schematic, cross-sectional diagrams partially in magnification, illustrating the formation of a large sphere planar opal.
Figure 3B:
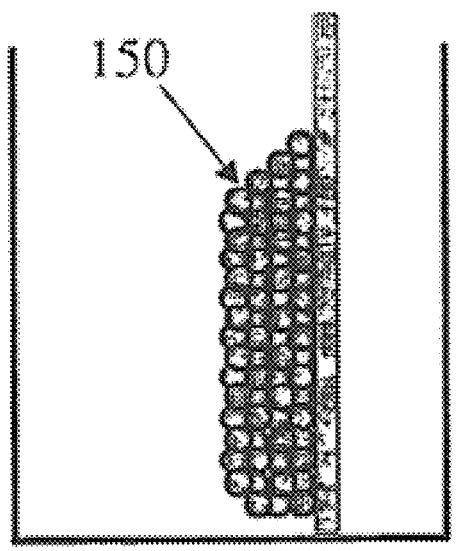

As shown in FIGS. 1 and 2, step 3 is self-assembling the silica spheres into a plurality of ordered, planar layers onto a planar substrate, preferably a silicon wafer or other suitable semiconductor substrate, to provide a large sphere planar opal. "Self-assembling" means providing appropriate structure and conditions so that the silica spheres spontaneously organize themselves into a complex structure. The nature (size, shape, order) of this structure is determined by the initial conditions of the self-assembly process. As shown in FIG. 3A, one approach is to place a substrate 100 into a solution of monodisperse silica spheres 110 of the appropriate diameter in a solvent 120 within a vessel 130. Due to capillary forces, self-assembly occurs at the meniscus 140 at the point at which the substrate extends out of the solution. Evaporation of the solvent causes the meniscus to "sweep" across the substrate, and a planar opal 150 is obtained as shown in FIG. 3B. To avoid the problem of sedimentation, in which large silica spheres fall to the bottom of the vessel before they are assembled, the temperature of the vessel 130 and the solvent 120 must be properly chosen. Mild heating either of a water/ethanol solution or an ethanol solution of large silica spheres (larger than about 400 nm) allows a large sphere planar opal to be formed before sedimentation occurs. The heat is preferably applied to the vessel so as to induce a slight temperature gradient from the bottom to the top of the vessel. This induces a slight convective flow that constantly provides particles to the meniscus region. When the silica spheres are monodisperse (step 1) and free of contaminants (step 2), the substrate can be covered with a large sphere planar opal. Formation of these large sphere planar opals is best accomplished when the vessel is well-isolated from all mechanical vibrations.

Figure 4:
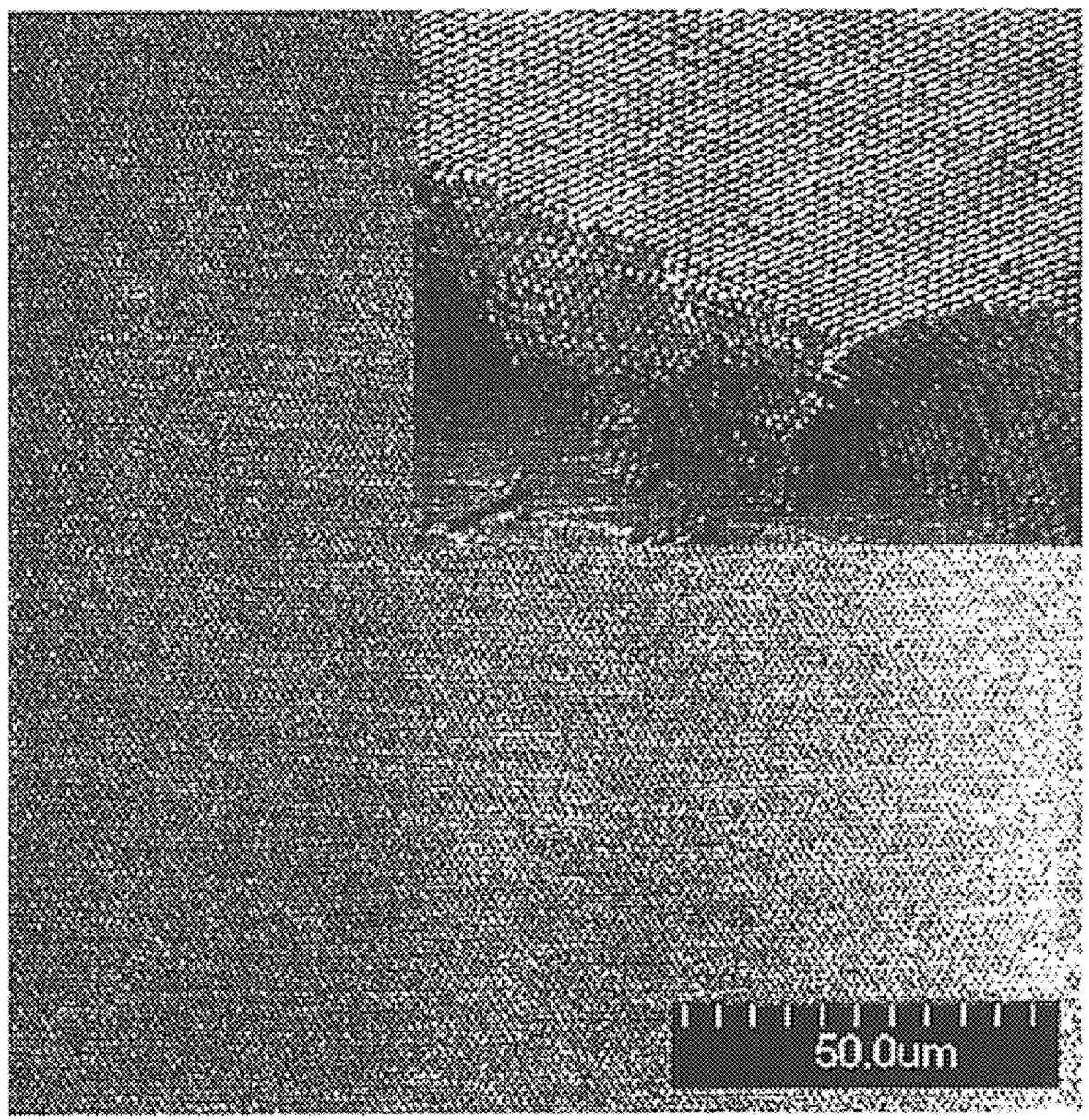
FIG. 4 is a scanning electron micrograph, in plan view with an inset in perspective view, of a large sphere planar opal made from 1 micron silica spheres.

FIG. 4 shows an example of a large sphere planar opal made in accordance with the method of the present invention. In this example, approximately 20 layers of 1 micron diameter silica spheres were self-assembled as a planar opal on a flat substrate. Since the spheres are arranged on a face-centered cubic (fcc) lattice, they form a crystal. This crystal is flat and well-ordered (that is, without grain boundaries) over an area that is at least several hundred microns by several hundred microns. The exact size of the crystal, in terms of area and thickness, is controlled by optimizing the self-assembly process. For example, the initial concentration of the silica spheres controls the thickness of the planar opal that is obtained. Thus, one of the advantages of this method is that the exact thickness of the photonic crystals that are obtained from these planar opals is controllable—a property that is desirable for many applications of these materials. Further, the rate of evaporation, the solvent mixture, and the concentration of the contaminants all influence the final planar opal.

Alternative approaches (to the one shown in FIG. 3) for the formation of large sphere planar opals include any method where a meniscus from a colloidal solution of silica spheres is swept across the substrate. This can be achieved, for example, by removing the substrate slowly from the colloidal solution or by sweeping a sharp edge, tip, or blade, which is in contact with a colloidal solution of silica spheres, across the substrate.

As shown in FIGS. 1 and 2, step 4 is sintering the planar opal so as to slightly fuse each silica sphere with its neighbors. Due to many previous studies on sedimented opals and inverted opals made from them, the importance of sintering is well-known (see, e.g., U.S. Pat. No. 6,139,626 to Norris et al.). The presence of contact points (or "necks") between the silica spheres is desirable since it increases the mechanical strength of the opal template. Further, these contact points may be used, if desired, to remove the silica material from an infiltrated planar opal (see step 6 below). To achieve sintering of the planar opal, the opal is heated for at least several hours, preferably at temperatures above 300° C. To avoid thermal shock, which may cause cracking or shrinkage of the planar opal, the oven is slowly heated from room temperature to the desired sintering temperature over several hours. Likewise, after sintering, the oven is slowly cooled back to room temperature. One desirable approach to sintering is to incorporate this step into the infiltration step (see step 5 below). For example, infiltration methods often require the opal template to be pre-heated to temperatures above 300° C. Thus, by pre-heating the opal in the infiltration apparatus, the opal may be simultaneously sintered and prepared for infiltration.

As shown in FIGS. 1 and 2, step 5 is infiltrating the planar opal with a predetermined material in order to obtain an infiltrated planar opal A. In particular, the predetermined material is infiltrated, either fully or partially, within interstitial spaces between the silica spheres. The predetermined material may be a high refractive index material (such as a semiconductor), a noble metal (such as silver), or an organic semiconductor. One preferable approach is to use chemical vapor deposition (CVD), but other common deposition methods may also be used. The conditions (for example, gas flow, pressure, and temperature) of the deposition apparatus are preferably adjusted to optimally infiltrate the planar opal with the predetermined material. By varying these conditions, the amount of the predetermined material that is deposited inside the structure can be controlled. In the case of high refractive index materials, the amount of predetermined material inside the planar opal can be an important parameter for obtaining a complete photonic band gap. See Busch et al., "Photonic Band Gap Formation in Certain Self-Organizing Systems", *Physical Review E*, Vol. 58, pp. 3896–3908 (1998). After deposition, the predetermined material may be further processed, if necessary, by thermal annealing as known in the art. For example, as described further below, low pressure chemical vapor deposition (LPCVD) can be used to fill the opal template, either partially or completely, with amorphous silicon. The amorphous silicon can subsequently be thermally annealed to poly-crystalline silicon (poly-Si). A key advantage of this latter step is that amorphous silicon is deposited with very little surface roughness. If desired, the amorphous silicon can be converted to poly-Si to inherit many of its desirable properties, such as its robust mechanical properties.

As shown in FIGS. 1 and 2, an optional step 6 is removing the silica material from the infiltrated planar opal in order to obtain an inverted planar opal B. This is achieved by selectively removing the silica spheres from the structure. For example, by chemically etching with aqueous or ethanolic hydrofluoric acid (HF) or buffered oxide etchant or some other suitable etchant, an inverted planar opal may be obtained. After removal of the silica spheres, a layered, ordered array of monodisperse spherical voids is provided within the planar opal. This method is particularly advantageous for providing monodisperse spherical voids having diameters of about 400 nanometers to about 2,000 nanometers.

After removal of the silica, an optional step 7 as shown in FIGS. 1 and 2 is further modifying the structure by some additional process—that is, "post-modifying" the photonic crystal. One example is that the inverted planar opal can be refilled, plated, or coated, either partially or completely, with another predetermined material to obtain a post-modified inverted planar opal C. The predetermined material may be a metal, polymer, or other material to improve the mechanical, optical, thermal, electrical, or photonic properties of the material. This can be done using a variety of methods, including liquid infiltration, gas deposition, or electrochemical deposition. Alternatively, it may simply involve an oxidation step to convert the outer surfaces of the inverted planar opal into the corresponding oxide (for example, converting silicon into silicon dioxide).

Another modification that may be performed as part of step 7 is to pattern or modify the inverted planar opal. As prepared, inverted planar opals are periodically patterned on an optical length scale. For device fabrication or to form a collection of photonic devices on a single substrate, it is also desirable to further pattern the planar opal on a much larger length scale, that is, on a length scale much greater than 1 micron. In other words, certain portions of the planar opal can be removed, patterned, or altered for a specific device application. For example, simple optical-lithography techniques and reactive ion etching may be used to form planar opals that occupy specific locations on a substrate, are a specific size (100 by 100 microns in area, for example), or have a specific shape (as necessary for a waveguide, for example). The rest of the planar opal may be removed. In this way, an optical integrated circuit or an opto-electronic integrated circuit may be fabricated from the initial planar opal.

Alternatively, it is also sometimes necessary or desirable to make small changes to the planar opal at specific points in the photonic crystal. In contrast to the above, these changes are on a length scale comparable to or smaller than the optical wavelength. For example, the locations of intentional defects in the photonic crystal are extremely important for determining their photonic properties. A lattice defect could be purposefully added to the initial planar opal by adding or removing a small portion of the lattice in a specific location by focused ion beam techniques, for example. Another example would be to create a vertical waveguide in planar opals by drilling a micron-scale hole in specific locations of the photonic crystal.

While such post-modification (step 7) may be used to modify inverted planar opals, similar optional processing may be used to modify infiltrated planar opals (step 8) to obtain post-modified infiltrated planar opals D. In this case, the silica spheres are not removed. Thus, the spaces occupied by the spheres cannot be refilled with another material. However, if the opal template is only partially filled during step 5, the remaining spaces can be filled with another predetermined material. In addition, the outer surfaces of the infiltrated planar opal can be coated or plated with an additional predetermined material. In either case, the predetermined materials may be a metal, polymer, or other material to improve the mechanical, optical, thermal, electrical, or photonic properties of the final structure. Further, the infiltrated planar opal can be patterned or modified as discussed above with regard to step 7.

It is also possible to modify the initial substrate prior to formation of the opal template. As shown in FIG. 2, an optional step 2a of the methods of the present invention is "pre-modifying" the initial substrate, which includes patterning or otherwise modifying the initial substrate to achieve pre-modified infiltrated planar opals A', pre-modified inverted planar opals B', pre- and post-modified inverted planar opals C', and pre- and post-modified infiltrated planar opals D'. By modifying the surface of the substrate in some way, either chemical, optical, electronic, or mechanical, the self-assembly of the large-sphere opals can be altered in some desirable way. For example, by using well-known lithographic techniques, trenches (depressions) may be formed in the substrate. During the self-assembly process, the spheres will prefer to crystallize in these depressed regions, such that the planar opal will form in only specific locations on the substrate or with a specific pattern. Alternatively, the substrate may be coated with a chemical that alters the surface properties of the substrate. Since the self-assembly is strongly dependent on the properties of the substrate surface, this modification can modify the formation of the planar opal. The pre-modifying of step 2a may even involve simply oxidizing the substrate to introduce a buffer layer, if desired, between the planar opal and the substrate.

As with post-modification, the pre-modification of the substrate may be on a large length scale (greater than 1 micron) or on a local length scale (comparable to the optical wavelength of interest). One example of pre-modifying on a local length scale is to pattern the substrate using the method of van Blaaderen et al. as set forth in "Template-Directed Colloidal Crystallization," Nature, Vol. 385, pp. 321–324 (Jan. 23, 1997). By patterning the substrate on a scale comparable to the optical wavelength, with techniques such as e-beam lithography or soft lithography (see Brittain et al., "Soft Lithography and Microfabrication," Physics World, Vol. 11, pp. 31–36, May 1998), the size, shape, and orientation of the planar opals can be controlled.

Furthermore, by combining both pre- and post-modification options, the methods of this invention provide an even larger range of different structures to be built from planar opals including pre- and post-modified inverted planar opals C', and pre- and post-modified infiltrated planar opals D'. In the particular case when the pre-modification is patterning performed with soft-lithography, and the post-modification is patterning performed with optical lithography, this approach is also extremely inexpensive and simple.

After the above steps, it is also possible to add additional layers of material on top of the photonic crystals for specific applications. These additional layers can improve properties such as electrical contact, thermal dissipation, mechanical stability and optical isolation. Such layers can also be used for packaging the devices or to planarize the structure.

To further illustrate the invention, a specific example of an implementation of the methods of the invention, which also produces materials of the invention, will now be described. This example is merely illustrative and is not to be construed as limiting the invention in any way.

EXAMPLE 1

In this example, a large sphere planar opal is fabricated directly on a silicon wafer and then infiltrated with amorphous silicon using the "low pressure chemical vapor deposition" technique (LP-CVD). After conversion of the amorphous silicon to polycrystalline silicon with an annealing step, the result is a post-modified inverted planar opal composed of silicon and grown directly on a silicon wafer.

Synthesizing the Silica Spheres: Colloidal silica spheres, approximately 850 nm in diameter, can be synthesized according to standard methods. A typical synthesis begins by soaking all necessary chemical glassware in 5% aqueous hydrofluoric acid for approximately 30 minutes and then rinsing the glassware with filtered and deionized ultrapure water. To prepare for the reaction, the following are mixed in a large pre-cleaned glass vessel: 1 liter of filtered, anhydrous, 200 proof ethanol; 126 mL of filtered and deionized ultrapure (that is, 18 MOhm) water; and 167 mL of filtered aqueous ammonium hydroxide (28% by weight). The first reaction is initiated by adding 74 mL of freshly distilled tetraethoxysilane (TEOS) to this mixture with rapid stirring. Within a few minutes, the reaction solution turns cloudy due to the formation of silica particles. The reaction vessel is then left stirring for approximately 10 hours. After this first reaction step, monodisperse silica spheres are obtained with a mean diameter of approximately 700 nm. To further increase the size of the silica spheres, a second reaction step is achieved by a further addition of 70 mL of freshly distilled TEOS. After stirring for an additional ten hours, monodisperse silica spheres of approximately 850 nm diameter are obtained. Spheres of 1 micron diameter can be made by a similar method by increasing the amount of TEOS added in the second reaction step.

Purifying the Silica Spheres: The silica particles are next removed from the reaction solution by centrifugation and are then resuspended in ethanol. The process of resuspension is facilitated by placing the vessel containing the spheres in an ultrasound bath. To fully purify the spheres, this centrifugation/resuspension cycle is repeated at least ten times. It is preferable to alternate the solvent for resuspension between ethanol and water. Following this purification, the silica spheres may be stored in ethanol.

Forming the Planar Opal on a Substrate by Self-assembly of Silica Spheres: Large sphere planar opals are then prepared on silicon substrates from the purified silica colloids. Described below are two sets of conditions that will provide large sphere planar opals of about 850 nm and 1 micron diameter spheres respectively. First, 850 nm spheres are suspended in absolute ethanol (1% by volume). The mixture is placed in a glass vial with an open top (20 mL capacity, Wheaton #986561) to allow evaporation of the ethanol. The vial is placed in a sand bath contained in a heating mantel. A clean silicon wafer is cut to fit in the vial and dipped vertically in the colloidal suspension. The sand is then heated by the heating mantel to obtain a temperature gradient across the vial (from 80° C. at the bottom of the vial to 65° C. near the top) and the solvent is allowed to completely evaporate (typically about 12 hours). The vial is preferably well-isolated during the evaporation from mechanical vibrations. When this process is completed, a large sphere planar opal (with a typical thickness of about 8–10 layers of close-packed spheres) is deposited on the silicon wafer. The thickness of the opal can be increased or decreased by increasing or decreasing the concentration of the silica spheres in the vial.

Alternatively, large sphere planar opals from 1 micron spheres may be grown by resuspending the spheres (3% by weight) in a 50:50 mixture of ethanol in water in a glass vial (as above). The sand bath is then heated such that the vial is about 70° C. at the bottom of the vial and about 60° C. at the top. When the solvent is completely evaporated, a large sphere opal template about 10–15 layers is obtained.

Sintering the Planar Opal: After deposition, the planar opal and substrate is then carefully removed and sintered in a furnace. Typically, the temperature is slowly raised over several hours up to approximately 500° C., maintained at this temperature for several hours, and then slowly cooled back to room temperature over several hours. As described above, this step is preferably included during the use of the CVD apparatus (see below). For CVD, the opal must first be preheated to 550° C. before silicon infiltration can be initiated. This automatically sinters the opal.

Infiltrating the Planar Opal with Silicon: Once such an opal template is prepared, the next step is to fill its interstitial spaces with Si. In the Blanco et al. article cited above, a special apparatus was utilized in which disilane was first condensed into the pores of the opal at cryogenic temperatures and then subsequently decomposed by heating at relatively high pressures (200 Torr). While homogeneous infiltration was demonstrated for sedimented opals, this process does not allow sufficient control over the deposition to fill thin planar opals.

Instead, in the present invention, planar opals are filled using a commercially available low-pressure chemical vapor deposition (LPCVD) furnace (for example, as provided by Tystar Corporation), which provides complete control of the growth parameters. Since LPCVD is surface-reaction-limited, this technique is, in principle, well-suited to conformal filling of the interstitials of the opal. Furthermore, a key advantage of LPCVD is that it is the standard silicon deposition technique for the microelectronics industry (e.g. complementary metal-oxide-semiconductor, or CMOS, technology). Unfortunately, under typical CMOS fabrication conditions near 600° C., filling the opal template can be problematic. First, infiltration of the structure can be limited by premature obstruction of the outermost channels (about 100 nm) of the opal which provide gas-transport to the innermost layers. Second, deposition results in poly-Si with grains (about 100 nm) that can introduce undesirable roughness at surfaces inside the final photonic crystal. By decreasing the temperature (550° C.), homogeneous infiltration with LPCVD has been achieved even for opal templates as thick as 40 layers. The lower temperature reduces the sticking coefficient of the precursor, allowing deposition to penetrate all the way to the silicon wafer without a visible interface (see FIG. 5). Temperatures below 580° C. also avoid internal surface roughness by uniformly depositing amorphous silicon, which may then be transformed into a poly-Si structure with smooth interfaces by annealing (600° C. for 8 hours) if desired. After deposition, the silica template is easily removed by wet-etching. Therefore, thin inverted planar opals of controllable thickness can be obtained (see FIGS. 6–9) that are incorporated directly into the wafer and inherit the advantageous mechanical properties of poly-Si.

Infiltration is then achieved by placing the planar opal (still attached to the silicon wafer) in the LP-CVD apparatus. To avoid thermal shock, the loading temperature is typically lowered to approximately 350° C. The temperature is then slowly raised to 550° C. for deposition of amorphous silicon. A flow (1500 standard cubic centimeters per minute) of 2% silane gas in dry nitrogen is used as the precursor gas. The pressure inside the LP-CVD chamber is typically 0.8 Torr. After approximately 5.5 hours the infiltration of the planar opal with amorphous silicon is complete.

Removing the Silica Spheres: To obtain silicon inverted planar opals, the silica spheres must be removed. Since the deposition process completely covers the outer surface of the planar opal template with a layer of silicon, it is necessary to break through this layer to remove the silica material inside. This can be achieved by mechanically cutting, breaking, or altering the silicon material to allow access to the interior of the silicon-infiltrated planar opal. For example, the semiconductor wafer, which acts as the substrate, can be cracked in half to expose the silica spheres inside. The silica material can then be removed by soaking the silicon-infiltrated planar opal in 5% aqueous hydrofluoric acid (HF) for approximately 1 hour. Alternatively, the silica can be removed using standard etching solutions such as buffered oxide etchant (BOE) which is well-known in the art for removing of silica. Due to the points of contact between the close-packed silica spheres, the etchant can enter through the cracked region and penetrate throughout the interior of the structure. Thus, essentially all of the silica material can be removed.

FIGS. 5–9 show cross-sectional electron micrographs of several examples of planar inverted opals made from silicon. In each image, the silicon wafer (which was used as the substrate in these examples) was broken in half. The electron micrographs in FIGS. 5–9 show the features along the break in the wafer. One can see a periodic arrangement of hollow silicon spheres that are attached to the silicon wafer. These spheres were caused by the removal of the silica. During the infiltration step 5 (in FIG. 1), the voids between the silica spheres were filled with silicon. In the removal step 6 (in FIG. 1), the silica was then removed while the silicon remained.

Figure 10:
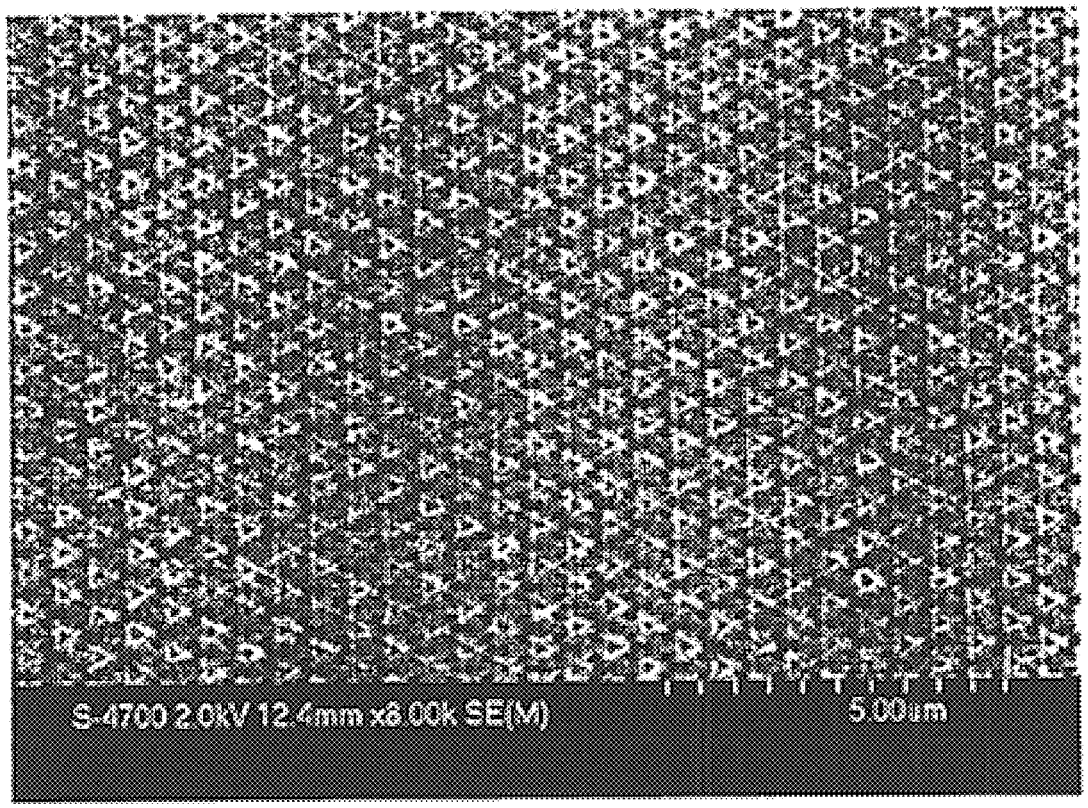
FIG. 10 is a scanning electron micrograph of the top surface of a silicon inverted planar opal manufactured in accordance with the present invention (magnification indicated by a scale bar)

In addition to breaking open the structure, an alternative approach for gaining access to the silica material inside the silicon-infiltrated planar opal is to use selective reactive ion etching (RIE). It is well-known in the art that, with the proper combination of gases, silicon is more easily etched by RIE than silica. By using RIE on the silicon-infiltrated planar opal, only the outermost silicon is removed from the top of the silicon-infiltrated planar opal; the silica spheres underneath behave as an "etch stop." After the silica spheres are exposed by RE, the structure is again soaked in etchant to remove the silica spheres. Using either approach, silicon inverted planar opals are obtained. However, by using the RIE approach, one can eliminate the Si coating (0.2–0.4 $\mu$m) on the top surface of the crystals, which can introduce unwanted photonic surface states. By performing selective RIE prior to wet-etching of the template, the silica spheres automatically terminate the etching one-half layer into the crystal. Thus, a planar (111) surface, initially buried inside the structure, may be exposed as shown in FIG. 10.

Figure 5:
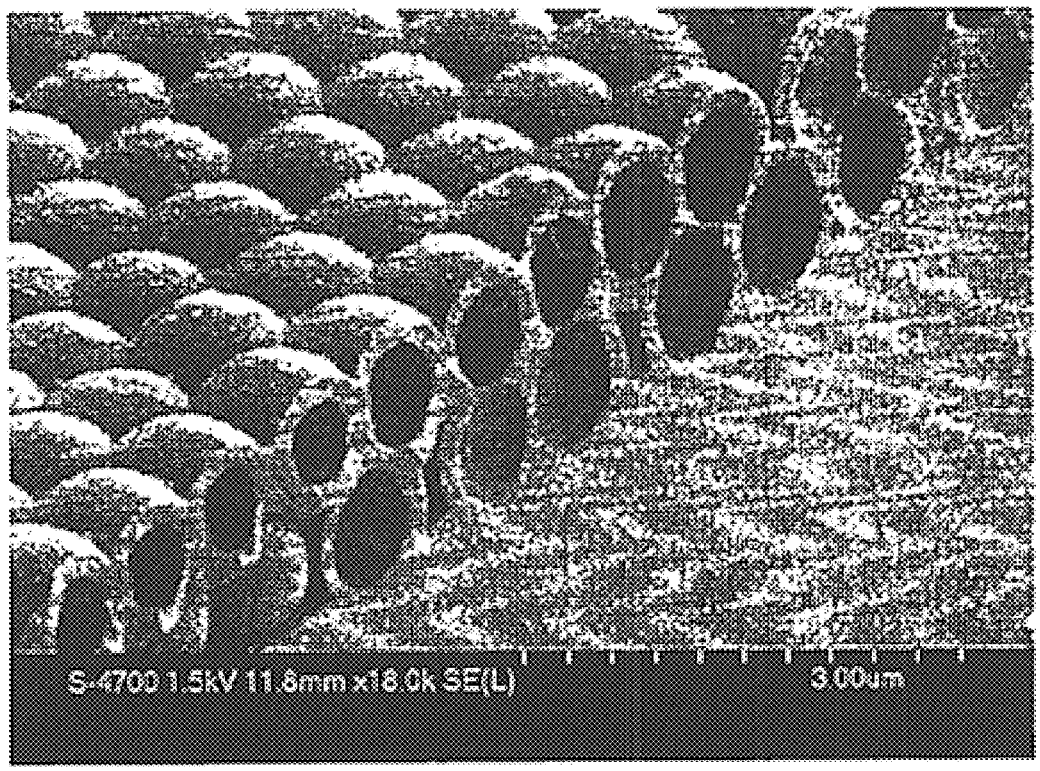
FIGS. 5–9 are cross-sectional scanning electron micrographs of silicon inverted planar opals manufactured in accordance with the present invention, which illustrate that by controlling the thickness of the initial planar opal, the thickness of the final inverted planar opal can be varied (magnification of each figure indicated by a scale bar)
Figure 6:
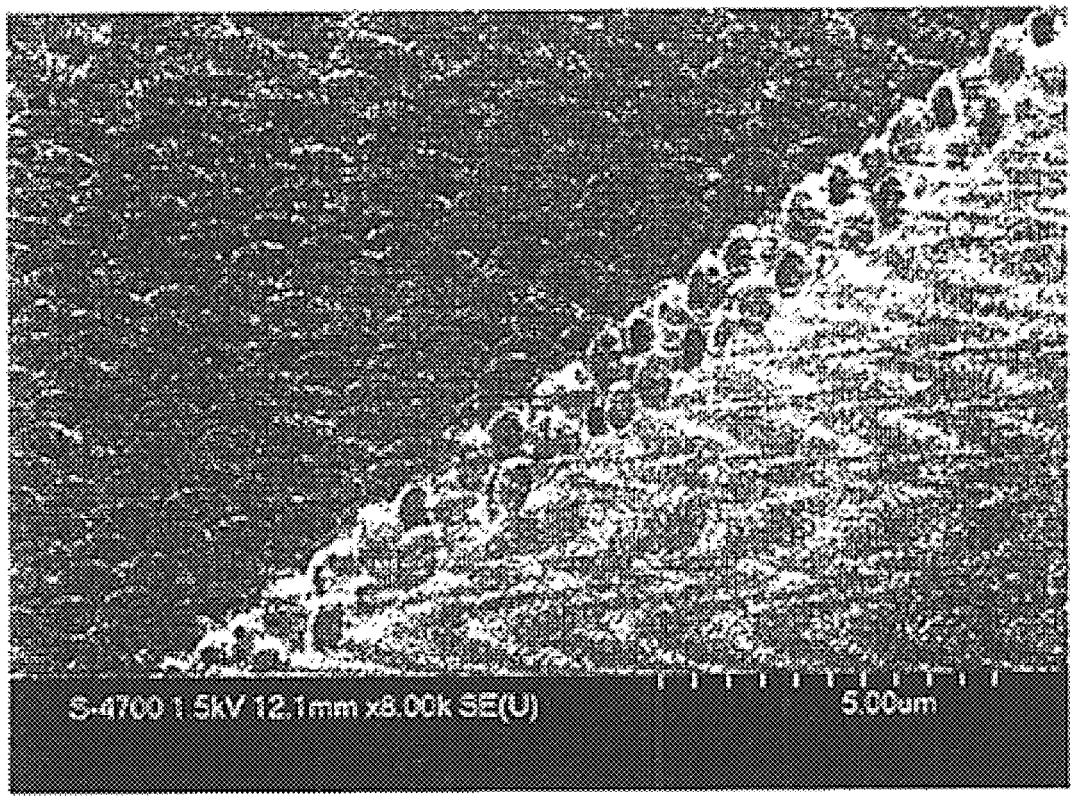
Figure 7:
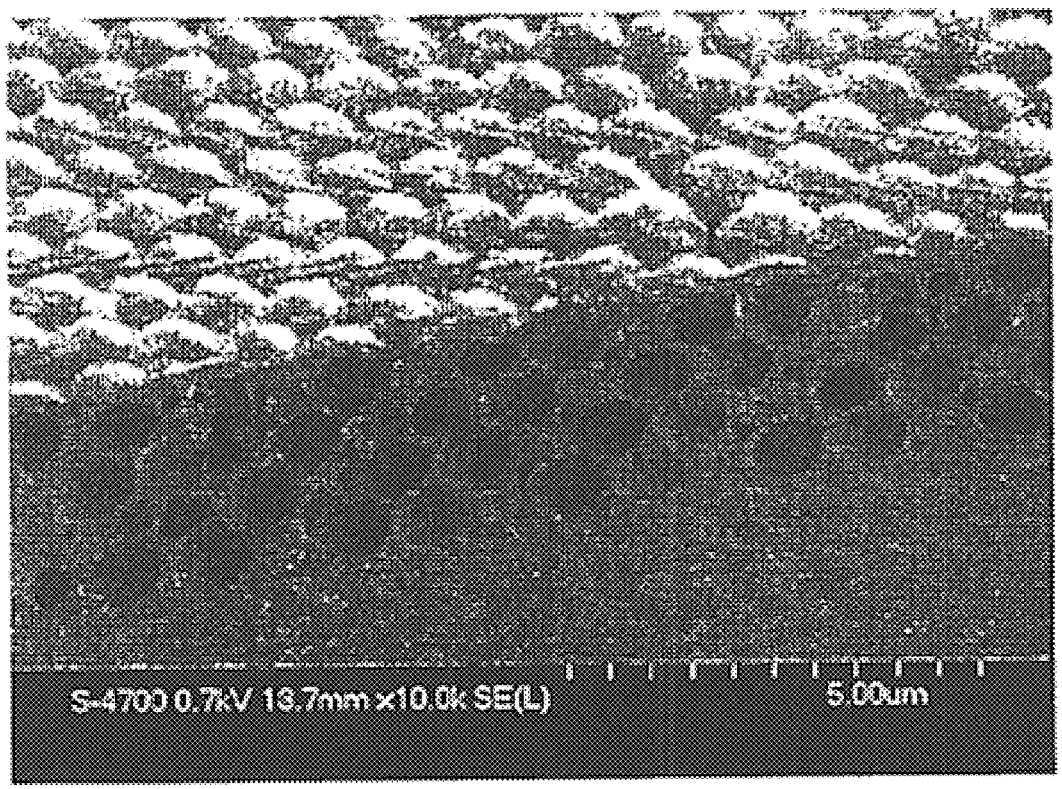
Figure 8:
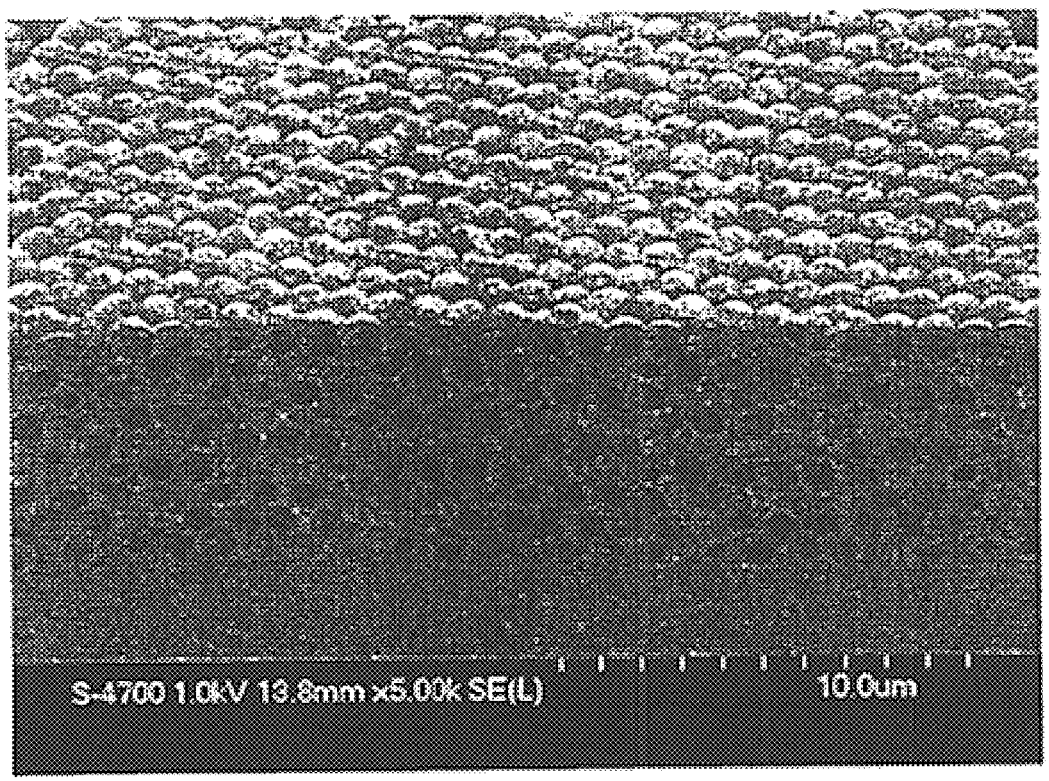
Figure 9:
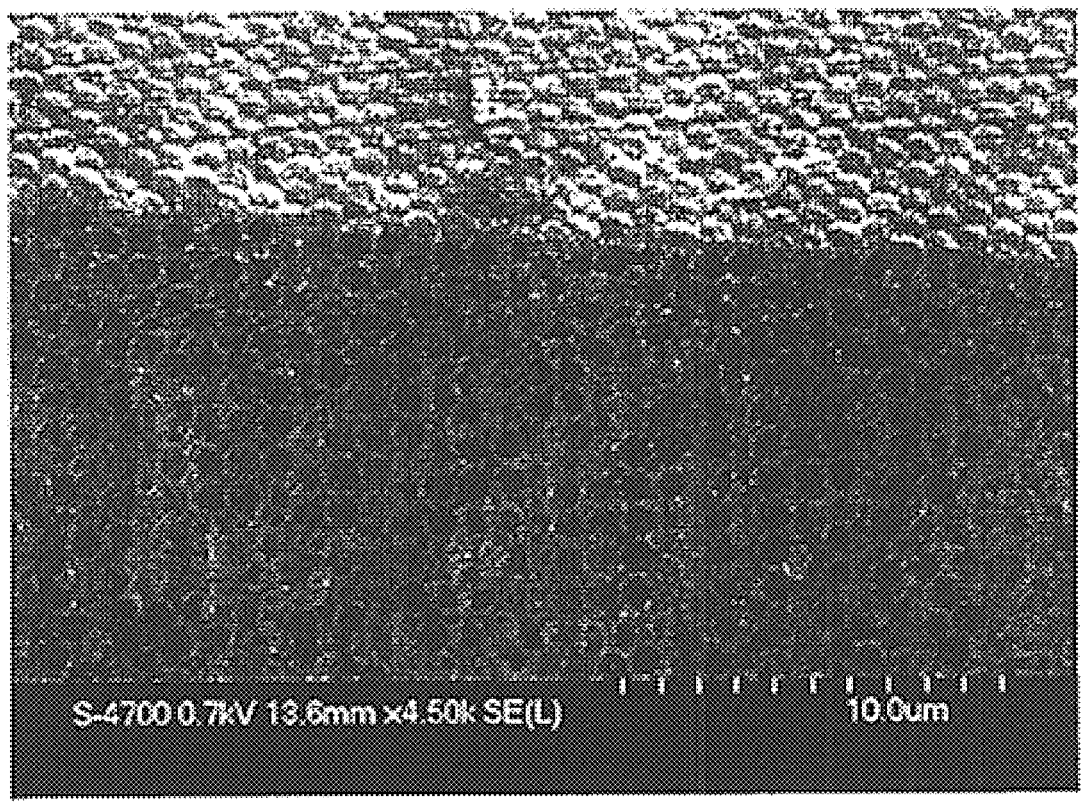

A significant advantage of the general method, described above, is that the inverted planar opal is grown directly upon, and thus integrated directly into, the semiconductor substrate, as shown in FIG. 5. This provides not only significant mechanical stability to the photonic crystal, but also provides direct electronic, thermal, and optical contact to the semiconductor substrate. This contact is desirable in many photonic applications of these materials. Alternatively, if direct contact with a semiconductor substrate is undesirable, buffer layers may be introduced (for example, by oxidation of the semiconductor) according to pre-modification step 2a as shown in FIG. 2 and as described hereinabove.

EXAMPLE 2

In this example, a silicon infiltrated planar opal is patterned by using conventional photolithography and RIE. The result is a post-modified inverted planar opal composed of silicon this is patterned for a desired application.

Figure 11:
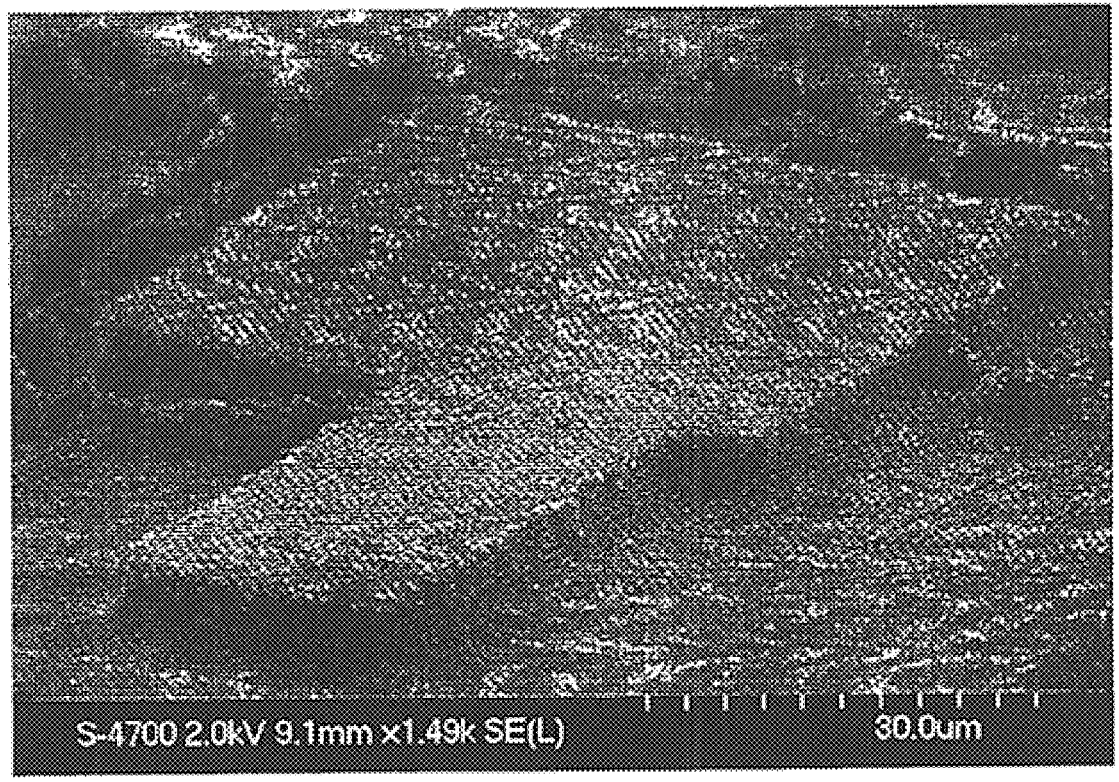
FIGS. 11–12 are a scanning electron micrographs, in perspective view, of patterned silicon inverted planar opals manufactured in accordance with the present invention (magnification of each figure indicated by a scale bar).

After a silicon infiltrated planar opal of desired thickness is obtained, as described in Example 1 above, the top layer of silicon is removed by RIE to expose the top layer of silica spheres. The structure is then spin-coated with a layer of photoresist, which is subsequently exposed with a Karl-Suss MA6 mask aligner. After developing the photoresist, the silica spheres are removed by immersing the sample in buffered HF (10%) for 1 hour. The result of these steps is a silicon inverted planar opal in which specific regions are masked by the photoresist. Anisotropic RIE is then used to remove the unmasked regions of the inverted planar opal. This is achieved with a PlasmaTherm 720 SLR RIE System operating with a flow of $SF_6$ (60 sccm) and $CCl_2F_2$ (20 sccm) at a pressure of 100 mTorr and 100 W RF power. After this dry-etching step, an oxygen plasma is used in the same apparatus to remove the photoresist. Thus, silicon post-modified (in this case, patterned) inverted planar silicon opals can be obtained as shown in FIG. 11.

EXAMPLE 3

In this example, a silicon infiltrated planar opal is patterned by using a slight modification of the procedure of Example 2. The result is a post-modified inverted planar opal composed of silicon that is patterned for a desired application.

Figure 12:
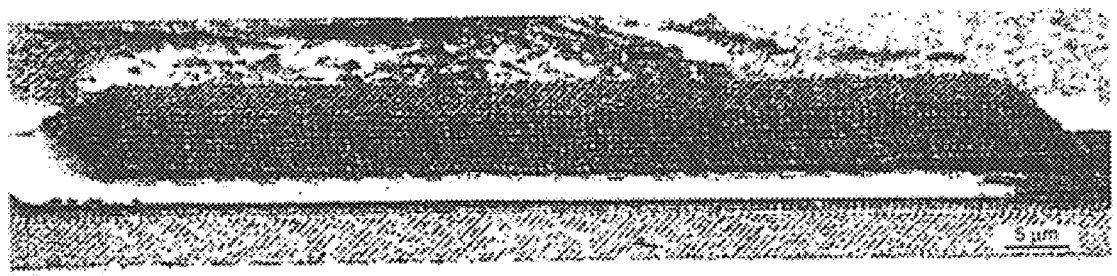

After a planar silicon infiltrated planar opal of desired thickness is obtained, as described in Example 1, the top layer of silicon is removed by RIE to expose the top layer of silica spheres. The structure is then spin-coated with a layer of photoresist, which is subsequently exposed with a Karl-Suss MA6 mask aligner. After developing the photoresist, the sample is immersed in buffered HF (10%). However, in contrast to Example 2, the time of etching is carefully adjusted such that the silica spheres that are underneath the photoresist are not etched away while the spheres that are not covered by the photoresist are completely removed. This selectivity can be achieved since the spheres that are underneath the photoresist are much less accessible to the etchant. The advantage of keeping the spheres underneath the photoresist is that during the next step, anisotropic RIE, the spheres act as an etch stop. In other words, the silica spheres protect a certain region of the structure. Thus, after using the RIE conditions discussed in Example 2 and an oxygen plasma step to remove the photoresist, an infiltrated planar opal is obtained which is patterned in a specific manner (as determined by the mask). The remaining spheres can then be removed by immersing the sample a second time in buffered HF (10%). Using this modified approach, silicon post-modified (in this case, patterned) inverted planar opals can be obtained as shown in FIG. 12.

While there have been described and illustrated herein various methods for creating planar opals using self-assembly, it will be apparent to those skilled in the art that further variations and modifications are possible without deviating from the broad teachings and spirit of the invention which shall be limited solely by the scope of the claims appended hereto.

What is claimed is:

1. A method for manufacturing a large sphere planar opal, the method comprising the steps of:
    (a) synthesizing monodisperse silica spheres, wherein each of the silica spheres has a diameter greater than or equal to about 400 nanometers and whrein the synthesizing step includes preparing a colloidal solution of the monodisperse silica spheres;
    (b) purifying the silica spheres; and
    (c) self-assembling the silica spheres into a plurality of ordered, planar layers on a substrate, wherein the self-assembling step includes sweeping meniscus of the colloidal solution across the substrate so as to provide self-assembly of e planar opal by capillary forces and wherein the meniscus is swept across the substrate by moving a sharp edge, tip, or blade, which is in close proximity to the substrate and in contact with e colloidal solution of silica spheres, across the substrate.

2. The method of claim 1, wherein the colloidal solution is heated so as to increase the evaporation rate of the solution and to avoid sedimentation of the silica spheres.

3. The method of claim 1, wherein the solvent of the colloidal solution is selected so as to increase the evaporation rate of th solution and avoid sedimentation of the silica spheres.

4. The method of claim 1, wherein temperature gradient is provided within the colloidal solution, thereby providing a convective flow that provides a constant flow of the silica spheres to a meniscus region of the colloidal solution.

5. The method of claim 1, wherein he substrate is a semiconductor.

6. The method of claim 1, wherein he substrate is a silicon wafer.

7. The method of claim 1, further comprising the step of sintering the silica spheres after the self-assembling step (c).

8. A method for manufacturing an infiltrated planar opal, the method comprising the steps of:
    (a) synthesizing monodisperse silica spheres, wherein each of the silica spheres has a diameter greater than or equal to about 400 nanometers and wherein the synthesizing step includes preparing a colloidal solution of the monodisperse silica spheres;
    (b) purifying the silica spheres;
    (c) self-assembling the silica spheres into a plurality of ordered, planar layers on a substrate to provide a planar opal, wherein the self-assembling step includes sweeping a meniscus of the colloidal solution across the substrate so as to provide self-assembly of the planar opal by capillary forces and wherein wherein the meniscus is swept across the substrate by moving a sharp edge, tip, or blade, which is in close proximity to the substrate and in contact with the colloidal solution of silica spheres, across the substrate
    (d) sintering the planar opal; and
    (e) infiltrating the planar opal with a first predetermined material.

9. The method of claim 8, wherein he colloidal solution is heated so as to increase the evaporation rate of the solution and to avoid sedimentation of the silica spheres.

10. The method of claim 8, wherein he solvent of the colloidal solution is selected so as to increase the evaporation rate of th solution and avoid sedimentation of the silica spheres.

11. The method of claim 8, wherein temperature gradient is provided within the colloidal solution, thereby providing a convective flow that provides a constant flow of the silica spheres to a meniscus region of the colloidal solution.

12. The method of claim 8, wherein the substrate is a semiconductor.

13. The method of claim 8, wherein the substrate is a silicon wafer.

14. The method of claim 8, wherein the first predetermined material is a high refractive index material.

15. The method of claim 8, wherein the first predetermined material is a semiconductor.

16. The method of claim 8, wherein the first predetermined material is silicon.

17. The method of claim 8, wherein the first predetermined material is amorphous silicon.

18. The method of claim 8, wherein the first predetermined material is polycrystalline silicon.

19. The method of claim 8, wherein the first predetermined material is amorphous silicon, and further comprising the step of annealing the amorphous silicon within the planar opal to form polycrystalline silicon.

20. The method of claim 8, wherein the first predetermined material is an organic semiconductor.

21. The method of claim 8, wherein the first predetermined material is a metal.

22. The method of claim 8, further comprising the step of pre-modifying the substrate prior to the self-assembling step (c), thereby providing a pre-modified infiltrated planar opal.

23. The method of claim 22, wherein the step of pre-modifying includes patterning the substrate using lithography.

24. The method of claim 22, wherein the step of pre-modifying includes patterning the substrate using etching.

25. The method of claim 8, further comprising the step of post-modifying the planar opal after the infiltrating step (e), thereby providing a post-modified infiltrated planar opal.

26. The method of claim 25, wherein the step of post-modifying includes patterning the planar opal using lithography.

27. The method of claim 25, wherein the step of post-modifying includes patterning the planar opal using etching.

28. The method of claim 25, wherein the step of post-modifying includes coating the planar opal with a second predetermined material.

29. The method of claim 25, wherein the step of post-modifying includes planarizing the planar opal.

30. The method of claim 8, further comprising the steps of (i) pre-modifying the substrate prior to the self-assembling step (c), and (ii) post-modifying the planar opal after the infiltrating step (e), thereby providing a pre- and post-modified infiltrated planar opal.

31. The method of claim 30, wherein the step of pre-modifying includes patterning the substrate using lithography.

32. The method of claim 30, wherein the step of pre-modifying includes patterning the substrate using etching.

33. The method of claim 30, wherein the step of post-modifying includes patterning the planar opal using lithography.

34. The method of claim 30, wherein the step of post-modifying includes patterning the planar opal using etching.

35. The method of claim 30, wherein the step of post-modifying includes coating the planar opal with a second predetermined material.

36. The method of claim 30, wherein the step of post-modifying includes planarizing the planar opal.

37. A method for manufacturing an inverted planar opal, the method comprising the steps of:
(a) synthesizing monodisperse silica spheres, wherein each of the silica spheres has a diameter greater than or equal to about 400 nanometers and wherein the synthesizing step includes preparing a colloidal solution of the monodisperse silica spheres;
(b) purifying the silica spheres;
(c) self-assembling the silica spheres into a plurality of ordered, planar layers on a substrate to provide a planar opal, wherein the self-assembling step includes sweeping a meniscus of the colloidal solution across the substrate so as to provide self-assembly of the planar opal by capillary forces and wherein the meniscus is swept across the substrate by moving a sharp edge, tip, or blade, which is in close proximity to the substrate and in contact with the colloidal solution of silica spheres, across the substrate;
(d) sintering the planar opal;
(e) infiltrating the planar opal with a first predetermined material; and
(f) removing the silica spheres.

38. The method of claim 37, wherein the colloidal solution is heated so as to increase the evaporation rate of the solution and to avoid sedimentation of the silica spheres.

39. The method of claim 37, wherein the solvent of the colloidal solution is selected so as to increase the evaporation rate of the solution and avoid sedimentation of the silica spheres.

40. The method of claim 37, wherein a temperature gradient is provided within the colloidal solution, thereby providing a convective flow that provides a constant flow of the silica spheres to a meniscus region of the colloidal solution.

41. The method of claim 37, wherein the substrate is a semiconductor.

42. The method of claim 37, wherein the substrate is a silicon wafer.

43. The method of claim 37, wherein the first predetermined material is a high refractive index material.

44. The method of claim 37, wherein the first predetermined material is a semiconductor.

45. The method of claim 37, wherein the first predetermined material is silicon.

46. The method of claim 37, wherein the first predetermined material is amorphous silicon.

47. The method of claim 37, wherein the first predetermined material is polycrystalline silicon.

48. The method of claim 37, wherein the first predetermined material is amorphous silicon, and further comprising the step of annealing the amorphous silicon within the planar opal to form polycrystalline silicon.

49. The method of claim 37, wherein the first predetermined material is an organic semiconductor.

50. The method of claim 37, wherein the first predetermined material is a metal.

51. The method of claim 37, further comprising the step of pre-modifying the substrate prior to the self-assembling step (c), thereby providing a pre-modified inverted planar opal.

52. The method of claim 51, wherein the step of pre-modifying includes patterning the substrate using lithography.

53. The method of claim 51, wherein the step of pre-modifying includes patterning the substrate using etching.

54. The method of claim 37, further comprising the step of post-modifying the planar opal after the removing step (f), thereby providing a post-modified inverted planar opal.

55. The method of claim 54, wherein the step of post-modifying includes patterning the planar opal using lithography.

56. The method of claim 54, wherein the step of post-modifying includes patterning the planar opal using etching.

57. The method of claim 54, wherein the step of post-modifying includes coating the planar opal with a second predetermined material.

58. The method of claim 54, wherein the step of post-modifying includes refilling the planar opal with a second predetermined material.

59. The method of claim 54, wherein the step of post-modifying includes planarizing the planar opal.

60. The method of claim 37, further comprising the steps of (i) pre-modifying the substrate prior to the self-assembling step (c), and (ii) post-modifying the planar opal after the removing step (f), thereby providing a pre- and port-modified inverted planar opal.

61. The method of claim 60, wherein the step of pre-modifying includes patterning the substrate using lithography.

62. The method of claim 60, wherein the step of pre-modifying includes patterning the substrate using etching.

63. The method of claim 60, wherein the step of post-modifying includes patterning the planar opal using lithography.

64. The method of claim 60, wherein the step of post-modifying includes patterning the planar opal using etching.

65. The method of claim 60, wherein the step of post-modifying includes coating the planar opal with a second predetermined material.

66. The method of claim 60, wherein the step of post-modifying includes refilling the planar opal with a second predetermined material.

67. The method of claim 60, wherein the step of post-modifying includes planarizing the planar opal.

* * * * *